(12) United States Patent
Leibiger et al.

(10) Patent No.: US 7,018,778 B1
(45) Date of Patent: Mar. 28, 2006

(54) SINGLE POLISILICON EMITTER BIPOLAR JUNCTION TRANSISTOR PROCESSING TECHNIQUE USING CUMULATIVE PHOTO RESIST APPLICATION AND PATTERNING

(75) Inventors: Steven M. Leibiger, Falmouth, ME (US); Laurence M. Szendrei, Gray, ME (US); Mark A. Doyle, Lyman, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 155 days.

(21) Appl. No.: 10/395,499

(22) Filed: Mar. 24, 2003

Related U.S. Application Data

(60) Provisional application No. 60/369,263, filed on Apr. 2, 2002.

(51) Int. Cl.
*G03F 7/26* (2006.01)
(52) U.S. Cl. .................................... 430/312; 430/314
(58) Field of Classification Search ............... 430/312, 430/314; 438/312, 319
See application file for complete search history.

(56) References Cited

U.S. PATENT DOCUMENTS

| | | | |
|---|---|---|---|
| 4,997,777 A | * | 3/1991 | Boivin ........................ 438/258 |
| 5,089,865 A | | 2/1992 | Mitsui et al. |
| 5,183,771 A | | 2/1993 | Mitsui et al. |
| 5,208,472 A | | 5/1993 | Su et al. |
| 5,290,717 A | * | 3/1994 | Shimazu ..................... 438/229 |
| 5,977,600 A | | 11/1999 | Wristers et al. |

* cited by examiner

*Primary Examiner*—Kathleen Duda
(74) *Attorney, Agent, or Firm*—Edwin H. Paul, Esq.; Cesari and McKenna, LLP

(57) ABSTRACT

A process for forming a bipolar transistor where the doping implantation of the extrinsic base regions does not affect the emitter doping levels. The techniques is to not remove the photoresist layer used to define the poly emitter contact. The photoresist layer for defining the extrinsic base regions overlays the photoresist layer over the emitter poly. When the base photoresist is processed to expose the base regions the photoresist over the emitter poly remains in tact. In this arrangement the base implantation is prevented from driving through the emitter poly and affecting the doping levels in the emitter.

6 Claims, 4 Drawing Sheets

DURING EXTRINSIC BASE IMPLANT

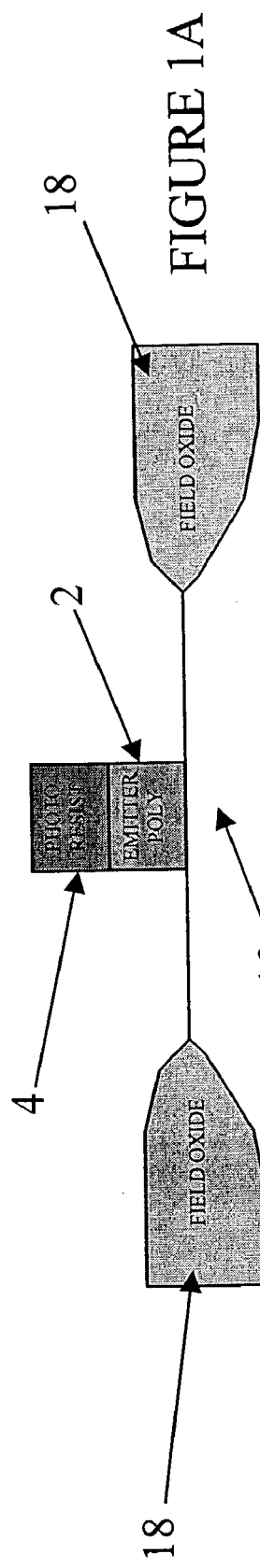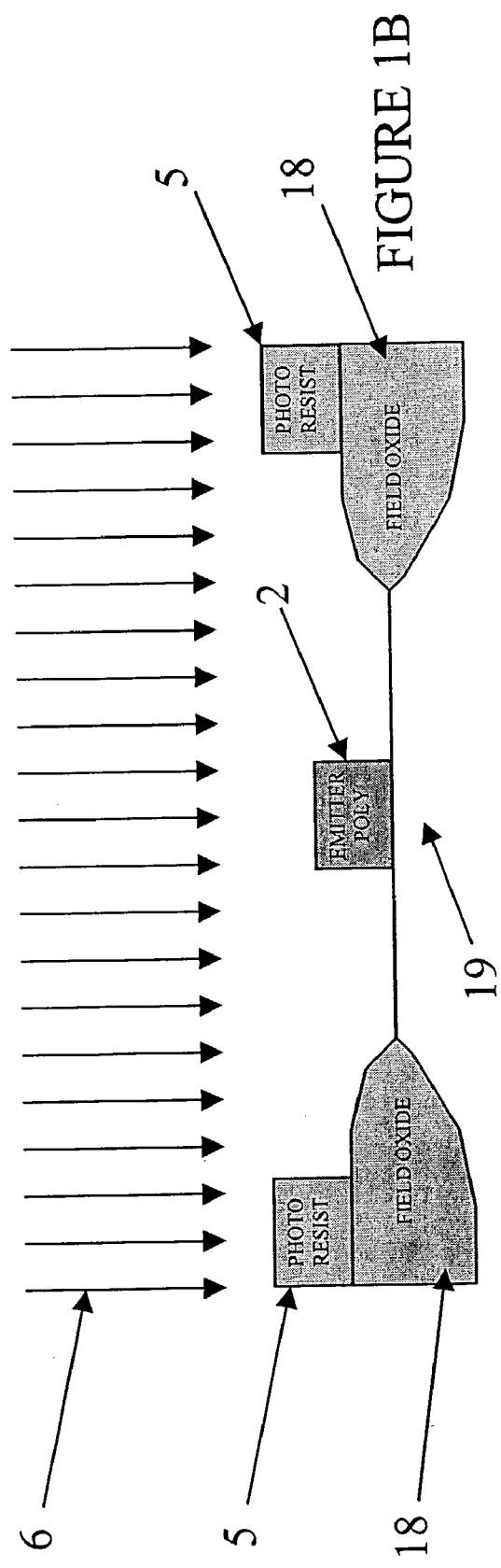

AFTER POLYSILICON EMITTER ETCH

DURING EXTRINSIC BASE IMPLANT

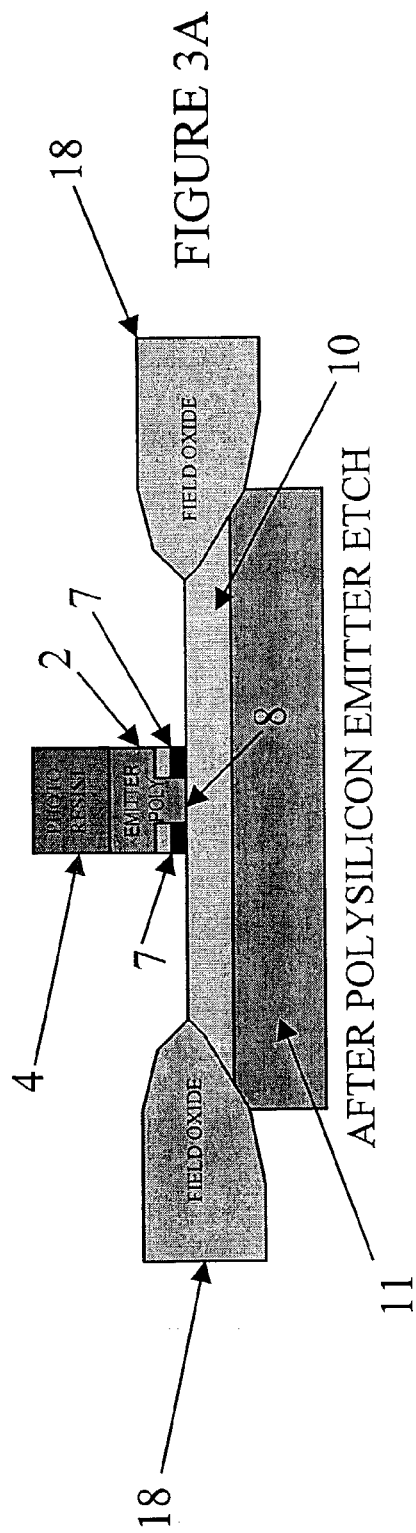
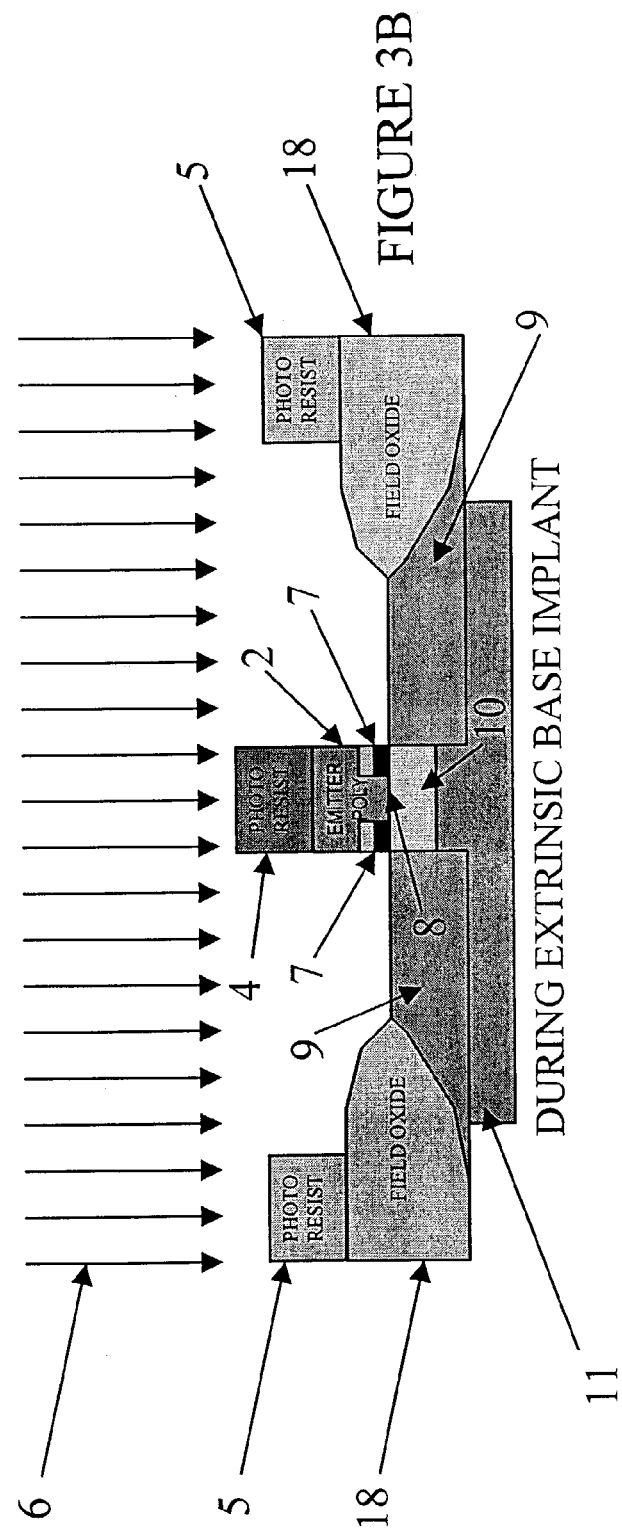

COMPLETED TRANSISTOR

SINGLE POLISILICON EMITTER BIPOLAR JUNCTION TRANSISTOR PROCESSING TECHNIQUE USING CUMULATIVE PHOTO RESIST APPLICATION AND PATTERNING

CROSS-REFERENCE TO RELATED APPLICATIONS

The present application claims the benefit of U.S. Provisional Patent Application Ser. No. 60/369,263, which was filed on Apr. 2, 2002, of common inventorship, title and ownership as the present application, and which provisional application is hereby incorporated herein by reference.

BACKGROUND OF THE INVENTION

1. Field of the Invention

The present invention relates to processing of single polysilicon bipolar junction transistors, and more particularly to the use of cumulative photoresist application patterning.

2. Background Information

For a standard single polysilicon (poly) bipolar junction transistor processing flow, the emitter poly is defined using photoresist and etched using industry standard methods. The emitter definition photoresist is stripped prior to the application and patterning of the extrinsic base implant photoresist. This approach uses the already defined poly emitter (rather than non-self-aligned extrinsic base masking photoresist) to self align the extrinsic base implant to the intrinsic transistor. As a result of this, the poly emitter is doped with the extrinsic base implant. Because this implant is a lower dose than the emitter implant, it does not change the doping type of the emitter, even though it is of the opposite doping type.

FIGS. 1A and 1B show a simplified processing sequence for this prior art. FIG. 1A shows the single poly transistor emitter stack just after the emitter poly has been etched. FIG. 1B shows the same transistor during the subsequent extrinsic base implant step. This step is required to reduce the external component of the base resistance and also to later allow the formation of ohmic base contacts. Notice that the emitter poly 2 is used to block the implant 6 from the intrinsic regions of the device. This is good in that it self-aligns the intrinsic and extrinsic parts of the BJT, but bad in that the emitter poly receives the implant.

By definition, the emitter and the bases of a bipolar transistor are of different doping polarities. So, in an NPN transistor, the emitter is doped n-type (possibly with arsenic) and the base p-type (probably with boron). Therefore, during the extrinsic base implant shown in FIG. 1B, the emitter poly will be counter doped with the base doping type. During the final anneal step the unwanted p-type dopant in the emitter poly is driven into the single crystal silicon below along with the intended emitter dopant. This contamination reduces the transistor current gain (beta) by lowering the resultant emitter doping at the base-emitter junction. Other transistor characteristics are also negatively impacted. To some extent, these effects can be mitigated by good device engineering, but they can never be entirely eliminated.

Even if device adjustments are made for the unwanted dopant in the emitter polysilicon, this prior art self-alignment method has other limitations. The most obvious is a constraint on the minimum emitter poly thickness, since this layer must be at least thick enough to block the extrinsic base implant. Without this constraint, the device design might choose to make the emitter poly thinner to better optimize the transistor.

The present invention is directed to the above and other limitations of the prior art.

SUMMARY OF THE INVENTION

The above limitations are addressed in the present invention by retaining the emitter poly definition photoresist layer during the subsequent extrinsic base implant. This photoresist is cured with ultra-violet light in a preferred embodiment, and the base photoresist is layered over the surface of the transistor. The base regions are exposed, developed, and base dopant implanted. In this arrangement the base dopant is prevented by the cured emitter definition photoresist from penetrating the emitter region and thereby adversely affecting the transistor characteristics, or constraining the emitter polysilicon thickness, as previously described.

BRIEF DESCRIPTION OF THE DRAWINGS

The invention description below refers to the accompanying drawings, of which:

FIGS. 1A and 1B are simplified flow cross sectional diagram of the prior art process flow; FIGS. 3A, 3B, and 3C are more detailed cross sectional process flow diagrams showing the integration of the present invention into a single polysilicon quasi-self-aligned (QSA) emitter process flow.

DETAILED DESCRIPTION OF AN ILLUSTRATIVE EMBODIMENT

Figure 2A:
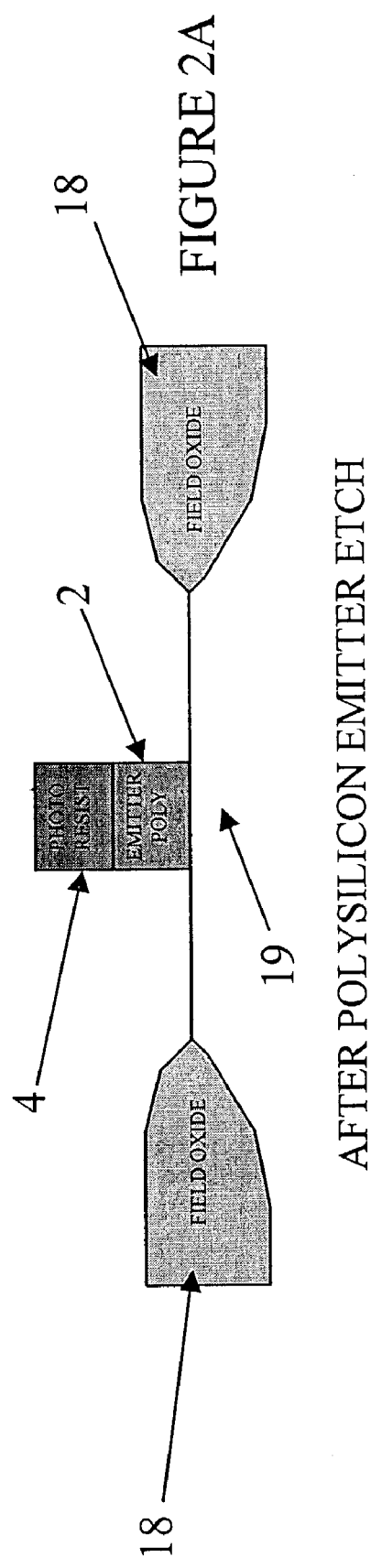
FIGS. 2A and 2B are simplified cross sectional diagrams illustrating the process flow of the present invention.
Figure 2B:
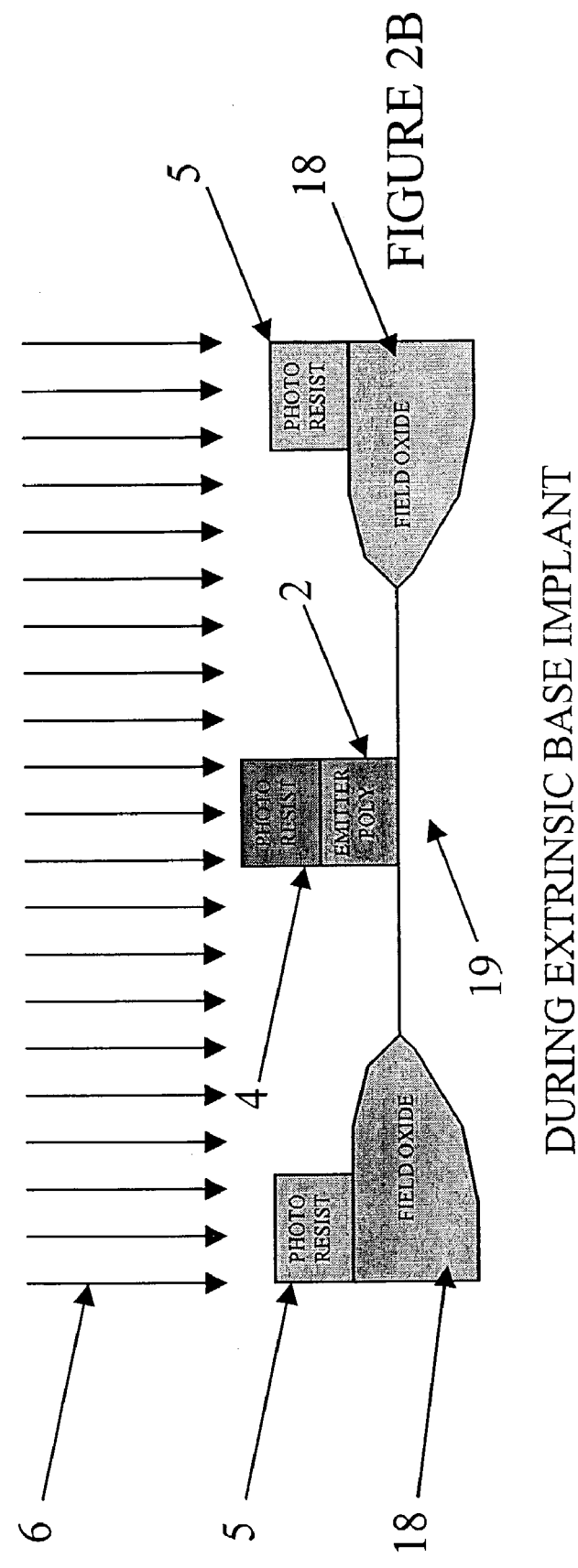

FIG. 2A shows the transistor after the emitter poly is etched leaving the same emitter poly 2 and photoresist 4 as in FIG. 1A. However, FIG. 2B shows that the photresist 4 remains over the emitter poly while the base implant is formed. After the poly pattern is defined in photoresist and etched, the photoresist is not removed. The extrinsic base implant masking photoresist is spun on the wafer, exposed, and developed. After these steps the wafer is patterned with photoresist that is a composite of the original poly definition photoresist and the additional extrinsic base definition photoresist. This is possible because the photoresist on the emitter poly is developed and ultra violet (UV) cured, and thus not affected by the subsequent exposure and development of the extrinsic base implant masking photoresist. The resulting transistor current gain is not degraded since there is no counter doping. Another benefit that springs from the base implant blocking effect on the emitter poly allows the thickness of the emitter poly to be optimized based on device performance without factoring in its ability of the emitter poly itself to block the base implant.

FIG. 3A shows a quasi-self-aligned (QSA) emitter bipolar transistor just after the emitter polysilicon definition etch. The emitter poly 2 rests on a doped silicon base region 10, which in turn overlies a collector region 11. Lateral isolation at the surface is provided by field oxide 18, fabricated in one of several standard ways. The connection between the emitter poly 2 and the base region is defined by an opening 8 in an emitter definition stack 7 consisting of one or more thin film insulating layers. This opening is not self-aligned to the emitter poly or the active area isolation, which is the reason that this type of transistor is called quasi-self-aligned, rather than fully-self-aligned. The emitter poly is defined by photoresist 4 and etched in the normal way. FIG. 3A is conceptually the same as the prior art shown in FIG. 1A up to this point.

However, in FIG. 3B, photoresist 4 is left over the emitter poly 2 when the base implant 6 is performed, in contrast to the prior art. This is done by not removing the photoresist 4 after the poly pattern is etched. Next, the extrinsic base implant masking photoresist 5 is spun on the wafer, exposed, and developed. As a result of this processing sequence, the wafer is patterned with photoresist that is a composite of the original poly definition photoresist 4 and the additional extrinsic base definition photoresist 5. This is possible because the photoresist on the emitter poly is developed and cured with ultra violet (UV) light and thus not affected by the subsequent exposure and development of the extrinsic base implant masking photoresist 5. It is evident that emitter poly 2 counter doping from the extrinsic base implant 6 of the emitter poly will not occur with this process flow. The extrinsic base implant 6 is still self-aligned to the emitter polysilicon 2, but without the unwanted counter doping inherent in the prior art. As a result, the transistor electrical characteristics are not adversely affected, and the device designer not con-stained as to the thickness of the poly silicon as with the prior art. The emitter poly thickness can thus be optimized for transistor performance without consideration of its implant stopping capability.

Figure 3C:
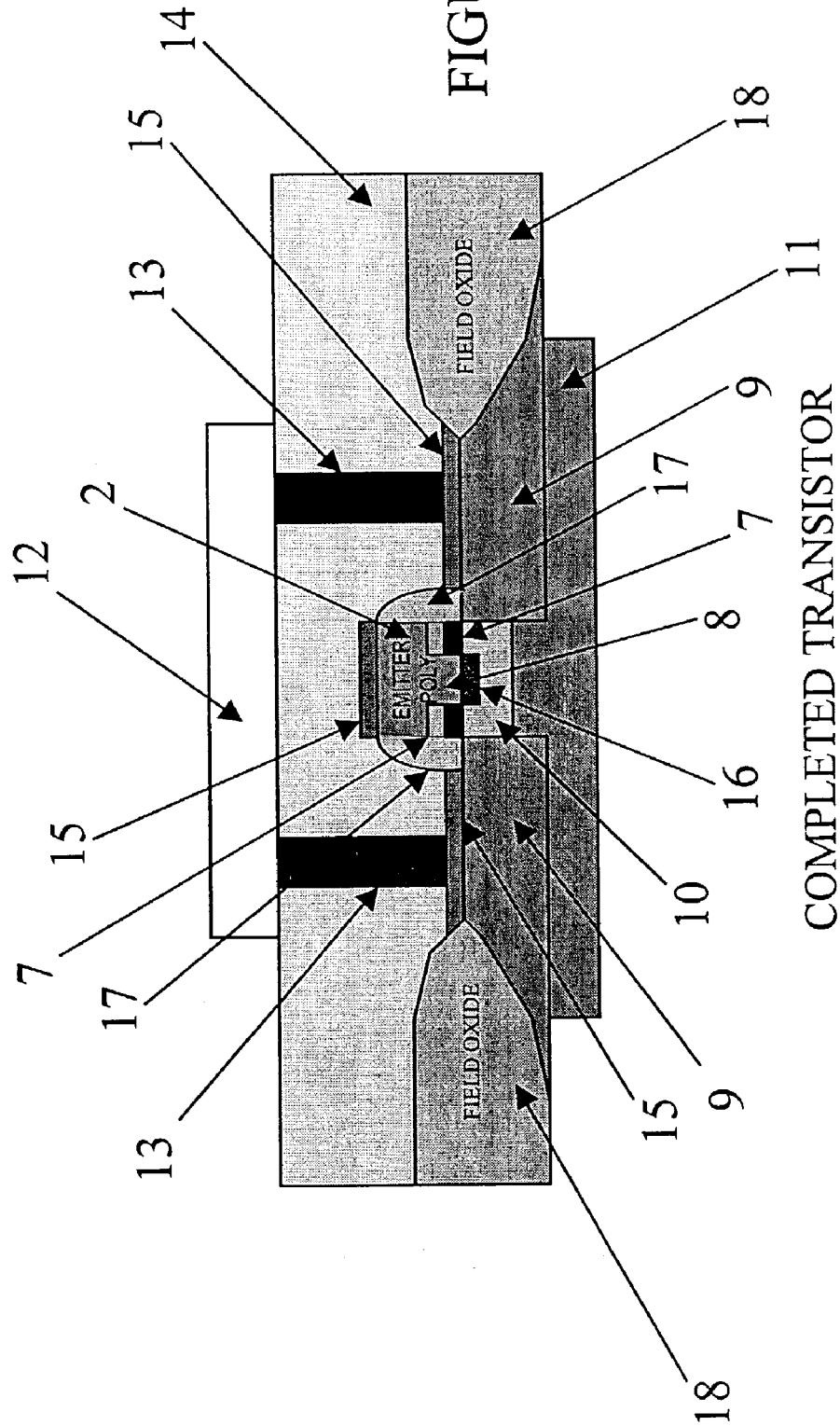

The completed transistor cross section is illustrated in FIG. 3C. In this example, oxide spacers 17, self-aligned silicide 15, interconnect dielectric 14, contact metal plugs 13, and interconnect metal 12, are added. Note that the intrinsic transistor emitter 16 is doped by the polysilicon emitter 2, though the emitter windows 8, in the emitter definition stack 7. In the case of the present invention, this doping is not contaminated by the extrinsic base implant 6 in any way.

What is claimed is:

1. A process for forming a quasi-self-aligned bipolar transistor structure having an emitter region and an extrinsic base region, the process comprising the steps of:
   applying a first photoresist on a semiconductor wafer;
   defining the emitter region via a first mask;
   exposing, developing, and curing the photoresist with respect to the first mask;
   etching the underlying emitter region using the pattern;
   applying a second photoresist to the surface of the semiconductor wafer;
   applying a second mask that laterally spaces the extrinsic base implant region from the emitter region,
   exposing and developing the second photoresist using the second mask; and
   implanting the extrinsic base region wherein the first and second photoresist layers block the extrinsic base implant from affecting the emitter region.

2. The process of claim 1 wherein the etched emitter consists of polysilicon.

3. The process of claim 1 wherein the bipolar transistor is an NPN type.

4. The process of claim 1 wherein the bipolar transistor is a PNP type.

5. The process of claim 1 further comprising the steps of:
   implementing a quasi-self-aligned architecture for the bipolar transistor comprising the steps of:
   stacking insulating layers with an emitter definition window etched through them, completely enclosing the emitter window by the first photoresist layer.

6. The process of claim 1 wherein the extrinsic base implant dopant does not affect the emitter region doping.

* * * * *